United States Patent
Chou et al.

(10) Patent No.: US 11,929,329 B2
(45) Date of Patent: Mar. 12, 2024

(54) DAMASCENE PROCESS USING CAP LAYER

(71) Applicant: Taiwan Semiconductor Manufacturing Co., Ltd., Hsinchu (TW)

(72) Inventors: Chia-Cheng Chou, Keelung (TW); Chung-Chi Ko, Nantou (TW); Tze-Liang Lee, Hsinchu (TW); Ming-Tsung Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 306 days.

(21) Appl. No.: 16/885,278

(22) Filed: May 28, 2020

(65) Prior Publication Data

US 2021/0375779 A1 Dec. 2, 2021

(51) Int. Cl.
*H01L 21/768* (2006.01)
*H01L 23/532* (2006.01)

(52) U.S. Cl.
CPC .. *H01L 23/53295* (2013.01); *H01L 21/76802* (2013.01); *H01L 21/76832* (2013.01); *H01L 21/76835* (2013.01); *H01L 21/76807* (2013.01); *H01L 21/7684* (2013.01)

(58) Field of Classification Search
CPC .......... H01L 23/53295; H01L 21/7684; H01L 21/76807; H01L 21/76811; H01L 21/76813; H01L 21/76832; H01L 21/76829–76834
See application file for complete search history.

(56) References Cited

U.S. PATENT DOCUMENTS

| | | | | |
|---|---|---|---|---|
| 6,756,321 B2 * | 6/2004 | Ko | ..................... | H01L 21/3185 257/E21.264 |
| 7,378,343 B2 * | 5/2008 | Chen | .................. | H01L 21/7681 438/700 |
| 7,701,060 B2 * | 4/2010 | Tada | ................. | H01L 21/76832 257/E21.585 |
| 8,212,337 B2 * | 7/2012 | Grill | ....................... | C23C 16/56 257/632 |
| 8,772,109 B2 | 7/2014 | Colinge | | |
| 8,785,285 B2 | 7/2014 | Tsai et al. | | |
| 8,816,444 B2 | 8/2014 | Wann et al. | | |
| 8,823,065 B2 | 9/2014 | Wang et al. | | |
| 8,860,148 B2 | 10/2014 | Hu et al. | | |
| 8,889,544 B2 * | 11/2014 | Wu | ..................... | H01L 21/7682 438/653 |
| 9,105,490 B2 | 8/2015 | Wang et al. | | |
| 9,236,267 B2 | 1/2016 | De et al. | | |
| 9,236,300 B2 | 1/2016 | Liaw | | |
| 9,520,482 B1 | 12/2016 | Chang et al. | | |
| 9,576,814 B2 | 2/2017 | Wu et al. | | |
| 9,842,804 B2 * | 12/2017 | Wang | .................. | H01L 23/5283 |

* cited by examiner

*Primary Examiner* — Daniel Luke
(74) *Attorney, Agent, or Firm* — JCIPRNET

(57) ABSTRACT

A semiconductor device including a substrate, a low-k dielectric layer, a cap layer, and a conductive layer is provided. The low-k dielectric layer is disposed over the substrate. The cap layer is disposed on the low-k dielectric layer, wherein a carbon atom content of the cap layer is greater than a carbon atom content of the low-k dielectric layer. The conductive layer is disposed in the cap layer and the low-k dielectric layer.

20 Claims, 3 Drawing Sheets

US 11,929,329 B2

DAMASCENE PROCESS USING CAP LAYER

BACKGROUND

As the density of semiconductor devices increases and as the size of circuit elements becomes smaller, resistance-capacitance (RC) delay time increasingly affects integrated circuit performance. Low-k dielectric materials, therefore, are used to reduce the RC delay. Low-k dielectric materials are particularly useful as inter-layer dielectrics and inter-metal dielectrics.

However, low-k dielectric materials present problems during processing. During the fabrication of the conductive material used to make interconnection, damage to the low-k dielectric materials often occurs. The leakage path caused by the damage to the low-k dielectric materials will reduce the electrical performance of semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
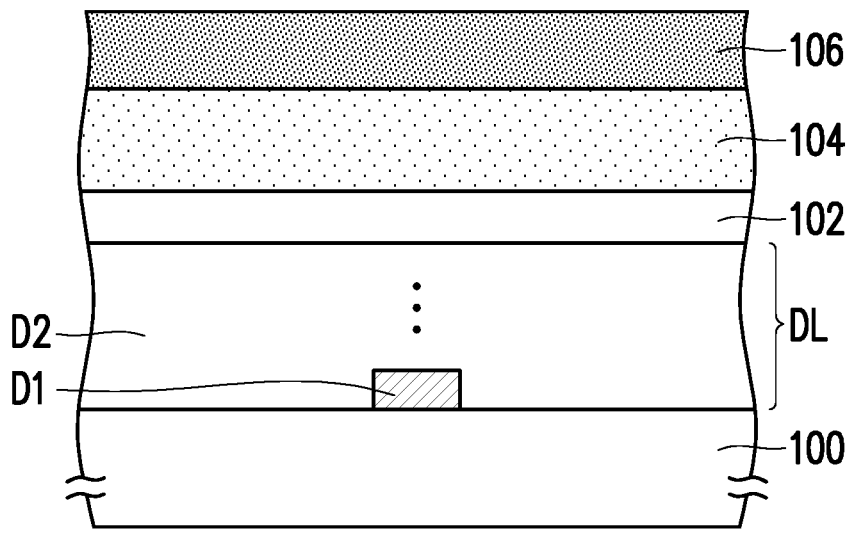
FIG. 1A to FIG. 1D are cross-sectional views illustrating various stages of a method of fabricating a semiconductor device in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIG. 1A is a cross-sectional view illustrating one stage of a method of fabricating a semiconductor device 10 in accordance with some embodiments of the disclosure. Referring to FIG. 1A, a substrate 100 is provided. The substrate 100 may be a semiconductor substrate, such as a bulk semiconductor substrate, a semiconductor-on-insulator (SOI) substrate, or the like. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate, may also be used.

In some embodiments, the substrate 100 includes a crystalline silicon substrate (e.g., wafer). In some alternative embodiments, the semiconductor substrate 100 is made of some other suitable elemental semiconductor, such as diamond or germanium; a suitable compound semiconductor, such as gallium arsenide, silicon carbide, gallium phosphide, indium phosphide, indium arsenide, and/or indium antimonide; or a suitable alloy semiconductor, such as SiGe, GaAsP, AlInAs, AlGaAs, GaInAs, GaInP, and/or GaInAsP. The substrate 100 may include various doped regions depending on design requirements (e.g., p-type semiconductor substrate or n-type semiconductor substrate). The doped regions may be doped with p-type or n-type dopants. For example, the doped regions may be doped with p-type dopants, such as boron (B) or $BF_2$; n-type dopants, such as phosphorus (P) or arsenic (As); and/or a combination thereof. The dopant concentration in various doped regions may be different.

In some embodiments, depending on product design requirements, a device layer DL may be formed on the substrate 100. The device layer DL may have a device D1, such as an active device (e.g., a transistor or the like) and/or a passive device (e.g., a capacitor, an inductor, or the like). The transistor may be a planar metal-oxide-semiconductor field-effect transistor (MOSFET), a FinFET, or a Gate All Around (GAA) transistor. Furthermore, the device layer DL may further include a dielectric layer D2, and the device D1 may be disposed in the dielectric layer D2. In some embodiments, the material of the dielectric layer D2 includes silicon oxide ($SiO_x$), silicon nitride ($SiN_x$), silicon oxynitride (SiON), phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some alternative embodiments, the material of the dielectric layer D2 includes a low-k dielectric material. The dielectric layer D2 may include one or more dielectric materials and/or one or more dielectric layers. In some embodiments, the dielectric layer D2 is formed to a suitable thickness by Flowable Chemical Vapor Deposition (FCVD), thermal chemical vapor deposition (CVD), High Density Plasma Chemical Vapor Deposition (HDPCVD), Sub Atmospheric Chemical Vapor Deposition (SACVD), spin-on, sputtering, or other suitable methods. Besides, the device layer DL may further include interconnect metal lines (not shown) to electrically connect to the device D1.

As illustrated in FIG. 1A, an etch stop layer 102 may be formed over the substrate 100. In some embodiments, the etch stop layer 102 is formed on the device layer DL. The etch stop layer 102 may be a single-layered structure or a multi-layered structure, such as a dual-layer structure, a tri-layer structure, or a four-layer structure etc. In some embodiments, the thickness of the single-layered structure or the thickness of each layer of multi-layered structure ranges from 5 angstrom (Å) to 150 Å. The material of the etch stop layer 102 may include silicon oxide, silicon nitride, silicon carbon nitride (SiCN), silicon carbon oxide (SiCO), silicon carbide (SiC), metal oxide (e.g., $AlO_x$, $TiO_x$, $ZnO_x$, $MnO_x$ etc.), metal nitride (e.g., $AlN_x$), metal oxynitride (e.g., $AlO_xN_y$, $TiO_xN_y$ etc.) or a combination thereof. The etch stop layer 102 may be formed by plasma enhanced chemical vapor deposition (PECVD), plasma enhanced atomic layer deposition (PEALD), CVD, thermal ALD, physical vapor deposition (PVD), a combination thereof, or the like.

When the etch stop layer 102 is provided with a multi-layered structure, the lower portion and the upper portion of the etch stop layer 102 are formed with different materials with different etching selectivity. For example, when the etch stop layer 102 is provided with a bi-layer structure, the lower portion of the etch stop layer 102 includes $AlO_xN_y$, and the upper portion of the etch stop layer 102 includes SiCO or SiC. For example, when the etch stop layer 102 is provided with a tri-layer structure, the lower portion of the etch stop layer 102 includes $AlO_xN_y$, the middle portion of the etch stop layer 102 includes SiCO, and the upper portion of the etch stop layer 102 includes $AlO_x$. For example, when the etch stop layer 102 is provided with a four-layer structure, the etch stop layer 102 includes, from bottom to top, $AlO_xN_y$, SiCO, $AlO_x$ and SiCO.

A low-k dielectric layer 104 is formed over the substrate 100. In some embodiments, the low-k dielectric layer 104 may be formed on the etch stop layer 102. The etch stop layer 102 may be disposed between the substrate 100 and the low-k dielectric layer 104. The dielectric constant of the low-k dielectric layer 104 may be less than 3.5. For example, the dielectric constant of the low-k dielectric layer 104 ranges from 2.6 to 3.3, such as 2.7, 2.8, 2.9, 3.0, 3.1, or 3.2, including any range between any two of the preceding values. In some embodiments, the low-k dielectric layer 104 includes a porous dielectric material. In some embodiments, the low-k dielectric layer 104 includes elements such as Si, O, C, N and/or H. For example, the low-k dielectric layer 104 includes SiOCH, SiOC, SiOCN or a combination thereof. In some embodiments, the low-k dielectric layer 104 includes BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. The low-k dielectric layer 104 may include one or more dielectric materials and/or one or more dielectric layers. The low-k dielectric layer 104 may be formed to a suitable thickness by PECVD, PEALD, spin coating, a combination thereof, or the like.

A cap layer 106 is formed on the low-k dielectric layer 104. The dielectric constant of the cap layer 106 may range from 3.0 to 4.2, such as 3.1, 3.2, 3.3, 3.4, 3.5, 3.6, 3.7, 3.8, 3.9, 4.0, or 4.1, including any range between any two of the preceding values. The material of the cap layer 106 may include $SiO_x$, SiOC, or SiCOH. The cap layer 106 may include one or more dielectric materials and/or one or more dielectric layers. The cap layer 106 may be formed by PECVD, PEALD, thermal CVD, thermal ALD, PVD, spin coating, a combination thereof, or the like.

In some embodiments, the dielectric constant of the cap layer 106 is greater than the dielectric constant of the low-k dielectric layer 104. In some embodiments, the low-k dielectric layer 104 and the cap layer 106 include the same elements, but the atom content of each element is different. In some alternative embodiments, at least one element of the low-k dielectric layer 104 is different from the elements included in the cap layer 106.

In the disclosure, the cap layer 106 is designed to have a carbon atom content ranging from 20 at % to 35 at % or from 0 to 5 at %. The cap layer 106 with a higher carbon atom content is beneficial to increase its resistance to the subsequent polishing process. However, the polishing may become difficult when the carbon atom content of the cap layer 106 exceeds 35 at %. On the other hand, the high-quality carbon amount (such as Si—$CH_2$—Si bonds) may be decreased while the low-quality carbon amount (such as Si—$CH_3$ or Si—$(CH_2)_2$—Si bonds) may be increased when the carbon atom content of the cap layer 106 is less than 20 at %. Accordingly, the cap layer 106 with an ultra-low carbon atom content may be another choice to prevent generation of the low-quality carbon and therefore avoid degradation of the film quality.

In some embodiments, the carbon atom content of the cap layer 106 is greater than the carbon atom content of the low-k dielectric layer 104. For example, the carbon atom content of the cap layer 106 ranges from 20 at % to 35 at %, and the carbon atom content of the low-k dielectric layer 104 ranges from 10 at % to 25 at %. The carbon atom content of the cap layer 106 may range from 25 at % to 35 at %, such as 26 at %, 27 at %, 28 at %, 29 at %, 30 at %, 31 at %, 32 at %, 33 at %, or 34 at %, including any range between any two of the preceding values. The carbon atom content of the low-k dielectric layer 104 may range from 15 at % to 25 at %, such as 16 at %, 17 at %, 18 at %, 19 at %, 20 at %, 21 at %, 22 at %, 23 at %, or 24 at %, including any range between any two of the preceding values.

In some alternative embodiments, the carbon atom content of the cap layer 106 is less than the carbon atom content of the low-k dielectric layer 104. In some alternative embodiments, the carbon atom content of the cap layer 106 ranges from 0 to 5 at %, and the carbon atom content of the low-k dielectric layer 104 ranges from 10 at % to 25 at %. The carbon atom content of the cap layer 106 may range from 0 at % to 5 at %, such as 1 at %, 2 at %, 3 at %, or 4 at %, including any range between any two of the preceding values. In some embodiments, the cap layer 106 is a carbon-free cap layer.

In the disclosure, the cap layer 106 with any one of the above carbon atom content ranges (20-35 at % or 0-5 at %) may provide sufficient hardness, improved film quality and/or better damage resistance against the subsequently polishing process. The cap layer 106 is referred to as a polishing stop layer in some examples. In some embodiments, the cap layer 106 of the disclosure is provided with better damage resistance, so as to prevent surface dishing and therefore unnecessary metal coating or residue at the top surface of the cap layer 106. The leakage current can be reduced, and the time dependent dielectric breakdown (TDDB) window and the RC delay for back end of line (BEOL) circuit can be improved. Therefore, the electrical performance (e.g., reliability performance) of the semiconductor device can be enhanced.

In some embodiments, the carbon atom contents of the low-k dielectric layer 104 and the cap layer 106 may be measured by X-ray photoelectron spectroscopy (XPS). In some embodiments, the cap layer 106 may have a uniform carbon atom concentration. In some alternative embodiments, the cap layer 106 may have a gradient carbon atom concentration in a direction away from the substrate 100.

In some embodiments, the Mohs hardness of the cap layer 106 is higher than the Mohs hardness of the low-k dielectric layer 104. The Mohs hardness of the low-k dielectric layer 104 may ranges from 2 GPa to 8 GPa, such as 3 GPa, 4 GPa, 5 GPa, 6 GPa, or 7 GPa, including any range between any two of the preceding values. The Mohs hardness of the cap layer 106 may range from 5 GPa to 20 GPa, such as 6 GPa, 7 GPa, 8 GPa, 9 GPa, 10 GPa, 11 GPa, 12 GPa, 13 GPa, 14 GPa, 15 GPa, 16 GPa, 17 GPa, 18 GPa, or 19 GPa, including any range between any two of the preceding values. The cap layer 106 with such hardness range is beneficial to provide sufficient damage resistance against the subsequently polishing process.

Figure 1B:
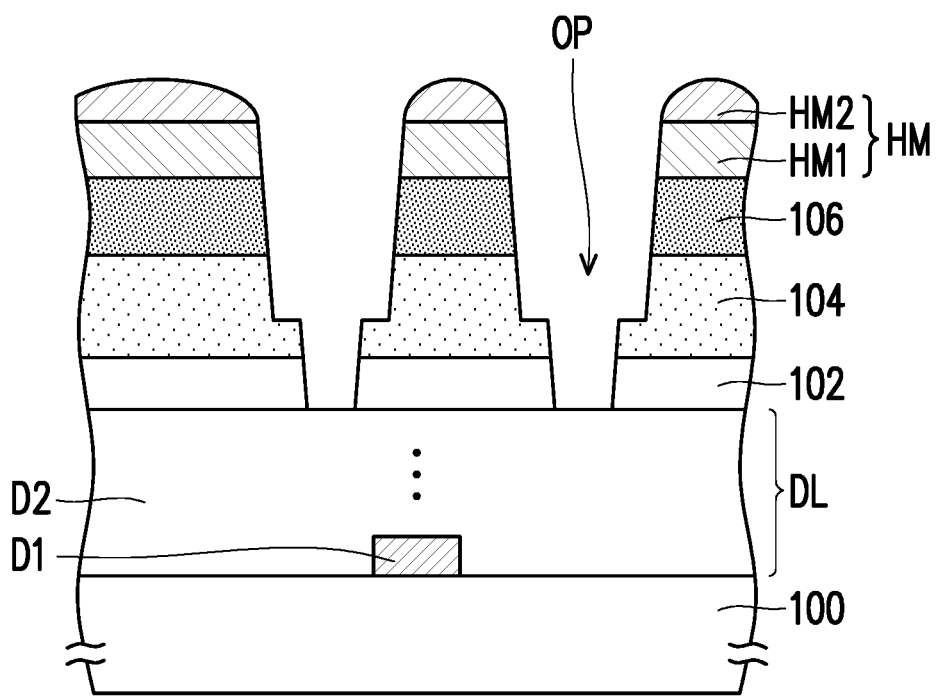

FIG. 1B is a cross-sectional view illustrating one stage of a method of fabricating a semiconductor device 10 in accordance with some embodiments of the disclosure. Referring to FIG. 1B, a patterned hard mask layer HM may be formed on the cap layer 106. In some embodiments, the material of the patterned hard mask layer HM includes silicon oxide, silicon nitride, silicon carbide, amorphous carbon, a photoresist material, tungsten-doped carbon (WDC), titanium nitride (TiN) a suitable hard mask material, or a combination thereof. In some embodiments, the patterned hard mask layer HM may be a single-layered structure. In some alternative embodiments, the patterned hard mask layer HM may be a multi-layered structure. For example, the patterned hard mask layer HM includes a lower mask layer HM1 and an upper mask layer HM2. The material of the lower mask layer HM1 may include silicon oxide. The material of the upper mask layer HM2 may include WDC or TiN. The patterned hard mask layer HM may be formed by performing deposition, lithography, and etching processes.

As illustrated in FIG. 1B, a patterning process may be performed to the cap layer 106, the low-k dielectric layer 104, and the etch stop layer 102 by using the patterned hard mask layer HM as a mask, thereby forming openings OP in the cap layer 106, the low-k dielectric layer 104, and the etch stop layer 102. The openings OP may expose the device layer DL. In some embodiments, the openings OP are single damascene openings. In some embodiments, the openings OP are dual damascene openings (as shown in FIG. 1B). The openings OP may be formed by via-first process, trench-first process, or double patterning process.

Figure 1C:
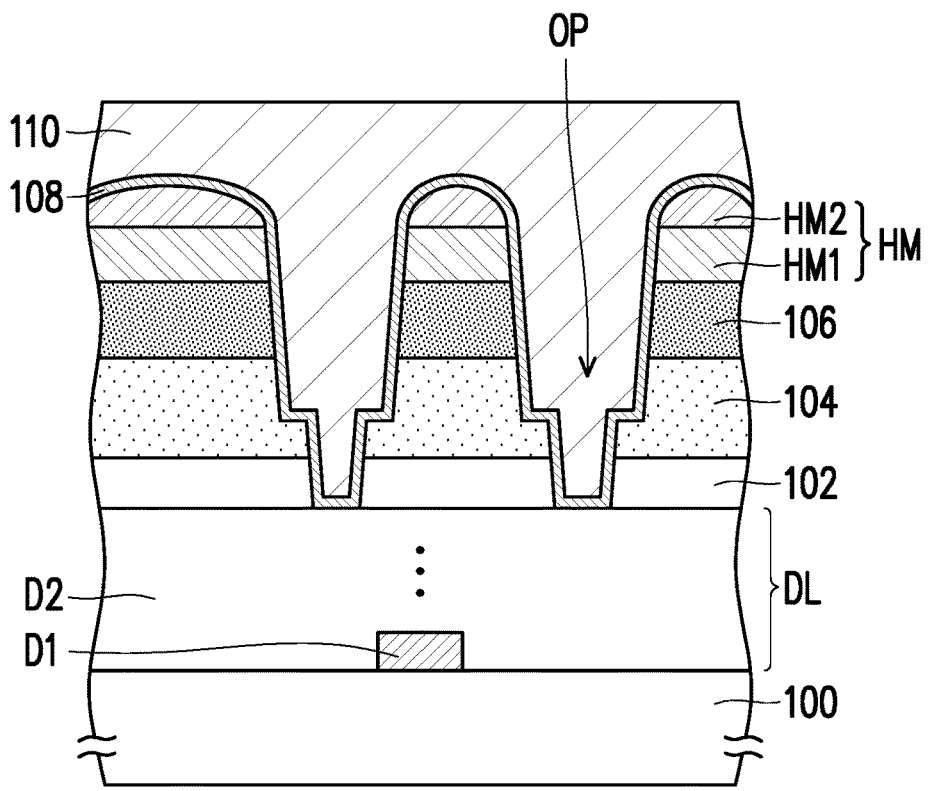

FIG. 1C is a cross-sectional view illustrating one stage of a method of fabricating a semiconductor device 10 in accordance with some embodiments of the disclosure. Referring to FIG. 1C, a barrier material layer 108 may be formed in the openings OP and on the patterned hard mask layer HM. In some embodiments, the barrier material layer 108 is conformally formed along the sidewalls and bottoms of the openings OP and the top surfaces of the patterned hard mask layer HM. The material of the barrier material layer 108 may include tantalum (Ta), tantalum nitride (TaN), titanium (Ti), titanium nitride (TiN) or a combination thereof. The barrier material layer 108 may be formed by, for example, PVD or ALD. It should be noted that the barrier material layer 108 illustrated in FIG. 1C may be omitted in some alternative embodiments.

As illustrated in FIG. 1C, a conductive material layer 110 may be formed in the openings OP. In some embodiments, the conductive material layer 110 is formed on the barrier material layer 108. The material of the conductive material layer 110 may include copper (Cu), ruthenium (Ru), cobalt (Co), or a combination thereof. The conductive material layer 110 may be formed by a plating process, CVD, PECVD, PVD, a combination thereof, or the like.

Figure 1D:
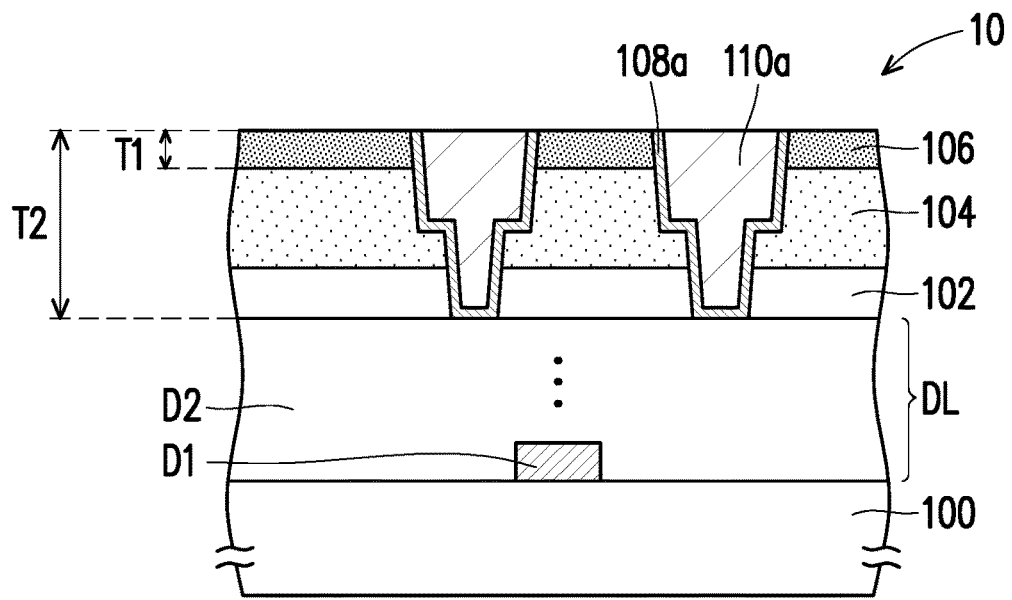

FIG. 1D is a cross-sectional view illustrating one stage of a method of fabricating a semiconductor device 10 in accordance with some embodiments of the disclosure. Referring to FIG. 1D, a polishing process such as a chemical mechanical polishing (CMP) process may be performed to the conductive material layer 110 to remove a portion of the conductive material layer 110 outside the openings OP, thereby forming a conductive layer 110a in the opening OP. The conductive layer 110a may be disposed in the cap layer 106, the low-k dielectric layer 104, and the etch stop layer 102. In some embodiments, the conductive layer 110a may be a single damascene structure. In some embodiments, the conductive layer 110a may be a dual damascene structure (as shown in FIG. 1D). The CMP process may be performed to the barrier material layer 108 to remove a portion of the barrier material layer 108 outside the openings OP, thereby forming a barrier layer 108a between the conductive layer 110a and the cap layer 106, between the conductive layer 110a and the low-k dielectric layer 104, between the conductive layer 110a and the etch stop layer 102, and between the conductive layer 110a and the device layer DL. In some embodiments, the patterned hard mask layer HM and a portion of cap layer 106 are removed in the above CMP process. In some embodiments, the conductive layer 110a and the barrier layer 108a may be electrically connected to the device D1 through the interconnect metal lines (not shown) of the device layer DL. Although a method of forming the conductive layer 110a and the barrier layer 108a is described by taking the above method as an example, the disclosure is not limited thereto. In some embodiments, a grinding process is performed instead of the mentioned polishing process. In some embodiments, an etching back process may be performed in combination with the mentioned polishing or grinding process.

In some embodiments, the thickness T1 of the cap layer 106 is less than 20% of the total thickness T2 of the etch stop layer 102, the low-k dielectric layer 104, and the cap layer 106 for reasonable capacitance impact. In some embodiments, the thickness T1 of the cap layer 106 is less than 18% of the total thickness T2 of the etch stop layer 102, the low-k dielectric layer 104, and the cap layer 106. In some embodiments, the thickness T1 of the cap layer 106 is less than 15% of the total thickness T2 of the etch stop layer 102, the low-k dielectric layer 104, and the cap layer 106. In some embodiments, the thickness T1 of the cap layer 106 is less than 10% of the total thickness T2 of the etch stop layer 102, the low-k dielectric layer 104, and the cap layer 106.

In some alternative embodiments, when the material of the lower mask layer HM1 is silicon oxide, the above CMP process may be stopped at the lower mask layer HM1. That is, at least a portion of the lower mask layer HM1 may be remained after performing the CMP process. Since the silicon oxide has very low carbon atom content (less than 5 at %), the lower mask layer HM1 made of silicon oxide may be used as the cap layer of the disclosure; that is, the operation of forming the cap layer 106 may be omitted in some alternative embodiments.

Figure 2:
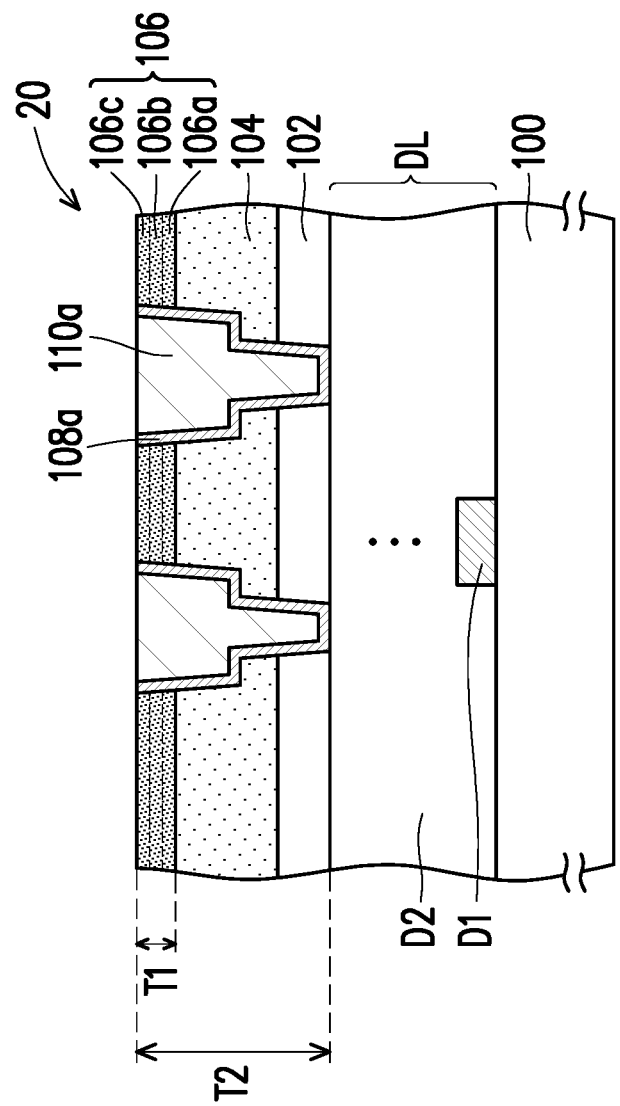
FIG. 2 is a cross-sectional view illustrating a semiconductor device in accordance with some alternative embodiments of the disclosure.

FIG. 2 is a cross-sectional view illustrating a semiconductor device in accordance with some alternative embodiments of the disclosure. The semiconductor device 20 in FIG. 2 is similar to the semiconductor device 10 in FIG. 1D, so similar elements are denoted by the same reference numeral and the detailed descriptions thereof are omitted herein.

As shown in FIG. 2, the cap layer 106 of the semiconductor device 20 may have a gradient carbon atom concentration in a direction away from the substrate 100. For example, the cap layer 106 includes, from bottom to top, films 106a, 106b, and 106c. In some embodiments, the carbon atom content of the film 106a is less than the carbon atom content of the film 106b, and the carbon atom content of the film 106b is less than the carbon atom content of the film 106c. That is, the carbon atom content of the cap layer 106 of the semiconductor device 20 may be gradually increased in a direction away from the substrate 100. In some alternative embodiments, the carbon atom content of the film 106a is greater than the carbon atom content of the film 106b, and the carbon atom content of the film 106b is greater than the carbon atom content of the film 106c. That is, the carbon atom content of the cap layer 106 of the semiconductor device 20 may be gradually decreased in a direction away from the substrate 100. The number of the films of the cap layer 106 is exemplified by three in FIG. 2, but the disclosure is not limited thereto. A dual-layer structure or a four-layer structure may be applied as needed.

The structures of the semiconductor devices are illustrated below with reference to FIG. 1D and FIG. 2. In some embodiments, the semiconductor device 10/20 includes a substrate 100, a low-k dielectric layer 104, a cap layer 106, and a conductive layer 108a. The low-k dielectric layer 104 is disposed over the substrate 100. The cap layer 106 is disposed on the low-k dielectric layer 104. The conductive layer 108a is disposed in the cap layer 106 and the low-k dielectric layer 104.

In some embodiments, a carbon atom content of the cap layer 106 is greater than a carbon atom content of the low-k dielectric layer 104. For example, the carbon atom content of the low-k dielectric layer 104 ranges from 10 at % to 25 at %, and the carbon atom content of the cap layer 106 ranges from 20 at % to 35 at %.

In some alternative embodiments, a carbon atom content of the cap layer 106 is less than a carbon atom content of the low-k dielectric layer 104. For example, the carbon atom content of the low-k dielectric layer 104 ranges from 10 at % to 25 at %, and the carbon atom content of the cap layer 106 ranges from 0 at % to 5 at %.

In some embodiments, a dielectric constant of the cap layer 106 is greater than a dielectric constant of the low-k dielectric layer 104. In some embodiments, a dielectric constant of the cap layer ranges from 3.0 to 4.2. In some embodiments, the dielectric constant of the low-k dielectric layer 104 is less than 3.5, such as from 2.6 to 3.3.

In some embodiments, a Mohs hardness of the cap layer 106 is higher than a Mohs hardness of the low-k dielectric layer 104. In some embodiments, the Mohs hardness of the low-k dielectric layer 104 ranges from 2 GPa to 8 GPa, and the Mohs hardness of the cap layer ranges from 5 GPa to 20 GPa.

In some embodiments, the semiconductor device 10/20 further includes an etch stop layer 102 disposed between the substrate 100 and the low-k dielectric layer 104. In some embodiments, a thickness of the cap layer 106 is less than 20% of a total thickness of the etch stop layer 102, the low-k dielectric layer 104, and the cap layer 106.

In some embodiments, the cap layer 106 has a uniform carbon atom concentration, as shown in FIG. 1D. In some alternative embodiments, the cap layer 106 has a gradient carbon atom concentration in a direction away from the substrate 100, as shown in FIG. 2.

In view of above, in the method of fabricating the semiconductor device of the disclosure, the carbon atom content of the cap layer ranges from 20 at % to 35 at % or from 0 to 5 at %. In the disclosure, the cap layer with any one of the above carbon atom content ranges (20-35 at % or 0-5 at %) may provide sufficient hardness, improved film quality and/or better damage resistance against the subsequently polishing process. Specifically, the cap layer of the disclosure is provided with better damage resistance, so as to prevent surface dishing and therefore unnecessary metal coating or residue at the top surface of the cap layer. The leakage current can be reduced, and the time dependent dielectric breakdown (TDDB) window and the RC delay for back end of line (BEOL) circuit can be improved. Therefore, the electrical performance (e.g., reliability performance) of the semiconductor device can be enhanced.

In accordance with some embodiments of the disclosure, a semiconductor device includes a substrate, a low-k dielectric layer, a cap layer, and a conductive layer. The low-k dielectric layer is disposed over the substrate. The cap layer is disposed on the low-k dielectric layer, wherein a carbon atom content of the cap layer is greater than a carbon atom content of the low-k dielectric layer. The conductive layer is disposed in the cap layer and the low-k dielectric layer.

In accordance with some alternative embodiments of the disclosure, a semiconductor device includes a substrate, a low-k dielectric layer, a cap layer, and a conductive layer. The low-k dielectric layer is disposed over the substrate. The cap layer is disposed on the low-k dielectric layer, wherein a carbon atom content of the cap layer ranges from 0 to 5 at %. The conductive layer is disposed in the cap layer and the low-k dielectric layer.

In accordance with some alternative embodiments of the disclosure, a method of fabricating a semiconductor device includes at least the following steps. A low-k dielectric layer is formed over a substrate. A cap layer is formed on the low-k dielectric layer, wherein a carbon atom content of the cap layer ranges from 20 at % to 35 at % or from 0 to 5 at %. A patterned hard mask layer is formed on the cap layer. The cap layer and the low-k dielectric layer are patterned by using the patterned hard mask layer as a mask, thereby forming an opening in the cap layer and the low-k dielectric layer. A conductive layer is formed in the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:

forming an etch stop layer over the substrate, wherein the etch stop layer is a four-layer structure comprising, from bottom to top, $AlO_xN_y$, SiCO, $AlO_x$ and SiCO;

forming a low-k dielectric layer over etch stop layer;
forming a cap layer on the low-k dielectric layer, wherein a carbon atom content of the cap layer ranges from 20 at % to 35 at % and is greater than a carbon atom content of the low-k dielectric layer;
forming a patterned hard mask layer on the cap layer;
patterning the cap layer and the low-k dielectric layer by using the patterned hard mask layer as a mask, thereby forming an opening in the cap layer and the low-k dielectric layer; and
forming a conductive layer in the opening.

2. The method of claim 1, further comprising:
forming a device layer between the etch stop layer and the substrate.

3. The method of claim 1, wherein the low-k dielectric layer comprises a porous material.

4. The method of claim 1, wherein a dielectric constant of the low-k dielectric layer is less than 3.5.

5. The method of claim 2, wherein each layer of the four-layer structure ranges from 5 Å to 150 Å.

6. The method of claim 1, wherein the opening is a damascene opening having a stepped sidewall in which a step is in the low-k dielectric layer.

7. The method of claim 1, further comprising, after forming the conductive layer in the opening, polishing the conductive layer and the patterned hard mask layer by using the cap layer as a polishing stop layer.

8. The method of claim 1, wherein the patterned hard mask layer comprises tungsten-doped carbon or TiN.

9. A method of forming semiconductor device, comprising:
forming a low-k dielectric layer over a substrate;
forming a cap layer on the low-k dielectric layer, wherein a carbon atom content of the cap layer is greater than a carbon atom content of the low-k dielectric layer;
forming a metal-containing mask layer on the cap layer;
patterning the cap layer and the low-k dielectric layer by using the metal-containing mask layer as a mask, thereby forming an opening in the cap layer and the low-k dielectric layer; and
forming a conductive layer in the opening,
wherein the method further comprises forming a four-layer etch stop structure between the low-k dielectric layer and the substrate, wherein the opening has a lower opening and an upper opening wider than the lower opening, and the entire four-layer etch stop structure is located around a lower sidewall of the lower opening.

10. The method of claim 9, wherein the carbon atom content of the low-k dielectric layer ranges from 10 at % to 25 at %.

11. The method of claim 9, wherein the carbon atom content of the cap layer ranges from 20 at % to 35 at %.

12. The method of claim 9, wherein a carbon atom content of the cap layer ranges from 25 at % to 35 at %, and a carbon atom content of the low-k dielectric layer ranges from 21 at % to 25 at %.

13. The method of claim 9, wherein a Mohs hardness of the cap layer is higher than a Mohs hardness of the low-k dielectric layer.

14. The method of claim 9, wherein the four-layer etch stop structure comprises, from bottom to top, a first layer, a second layer, a third layer and a fourth layer, and the second layer and the fourth layer comprise a same material.

15. The method of claim 9, wherein a dielectric constant of the cap layer is higher than a dielectric constant of the low-k dielectric layer.

16. The method of claim 9, wherein the cap layer is formed with a gradient carbon atom concentration in a direction away from the substrate.

17. A method of forming a semiconductor device, comprising:
forming a low-k dielectric layer over a substrate;
forming a cap layer on the low-k dielectric layer, wherein a carbon atom content of the cap layer ranges from 20 at % to 35 at % and is higher than a carbon atom content of the low-k dielectric layer;
forming a hard mask layer on the cap layer, wherein the hard mask layer comprises an oxide-based mask layer and a metal-containing mask layer on the oxide-based mask layer;
patterning the cap layer and the low-k dielectric layer by using the hard mask layer as a mask, thereby forming a damascene opening in the cap layer and the low-k dielectric layer, wherein the damascene opening has a stepped sidewall in which a step is in the low-k dielectric layer; and
forming a conductive layer in the damascene opening,
wherein the method further comprises forming a four-layer etch stop structure between the low-k dielectric layer and the substrate, wherein the damascene opening has a lower opening and an upper opening wider than the lower opening, and the entire four-layer etch stop structure is located around a lower sidewall of the lower opening.

18. The method of claim 17, wherein the four-layer structure comprising, from bottom to top, $AlO_xN_y$, SiCO, $AlO_x$ and SiCO.

19. The method of claim 17, wherein the cap layer is formed with a gradient carbon atom concentration in a direction away from the substrate.

20. The method of claim 17, further comprising, after forming the conductive layer in the opening, polishing the conductive layer and the hard mask layer, until the oxide-based mask layer of the hard mask layer is exposed.

* * * * *